United States Patent [19]

Cresswell

[11] 4,224,083
[45] Sep. 23, 1980

[54] DYNAMIC ISOLATION OF CONDUCTIVITY MODULATION STATES IN INTEGRATED CIRCUITS

[75] Inventor: Michael W. Cresswell, Pittsburgh, Pa.

[73] Assignee: Westinghouse Electric Corp., Pittsburgh, Pa.

[21] Appl. No.: 929,624

[22] Filed: Jul. 31, 1978

Related U.S. Application Data

[60] Division of Ser. No. 639,337, Dec. 10, 1975, abandoned, which is a continuation-in-part of Ser. No. 357,435, May 4, 1973, abandoned.

[51] Int. Cl.² ............... H01L 7/54; H01L 29/747; H01L 9/12
[52] U.S. Cl. ............................. 148/1.5; 148/187; 357/38; 357/91
[58] Field of Search ............... 148/1.5, 187; 357/91, 357/38, 39

[56] References Cited

U.S. PATENT DOCUMENTS

| | | | |
|---|---|---|---|
| 3,877,997 | 4/1975 | Brown | 148/1.5 |
| 3,893,153 | 7/1975 | Page et al. | 357/38 |
| 3,895,430 | 7/1975 | Wilson et al. | 29/584 |
| 3,897,273 | 7/1975 | Marsh et al. | 148/1.5 |
| 3,947,864 | 3/1976 | Yatsuo et al. | 357/39 |
| 4,092,660 | 5/1978 | Blocker | 357/22 |

*Primary Examiner*—L. Dewayne Rutledge
*Assistant Examiner*—Upendra Roy
*Attorney, Agent, or Firm*—C. L. Menzemer

[57] ABSTRACT

Conductivity modulation states in a first component of a power integrated circuit are dynamically isolated from a second component of the integrated circuit having at least one common active region with the first component by selective irradiation of portions of the common regions between the components. Preferably the irradiation is accomplished by masking the component portions of the body with a radiation shield and irradiating selected portions of the common active regions between the component portions with a suitable radiation source. The radiation source is preferably an electron beam of an energy level between about 1 and 3 Mev, preferably where the irradiation is carried to a dosage between $1 \times 10^{13}$ and $1 \times 10^{15}$ e/cm² and most desirably between $4 \times 10^{13}$ and $2 \times 10^{14}$ e/cm². New high speed bilateral thyristors, reverse switching rectifiers and reverse conducting thyristors are also provided.

12 Claims, 8 Drawing Figures

DYNAMIC ISOLATION OF CONDUCTIVITY MODULATION STATES IN INTEGRATED CIRCUITS

RELATED APPLICATION

This is a division of application Ser. No. 639,337 filed Dec. 10, 1975 now abandoned, which is a continuation-in-part of application Ser. No. 357,435, filed May 4, 1973 now abandoned.

FIELD OF THE INVENTION

The present invention relates to semiconductor devices such as monolithic integrated circuits and particularly dynamic isolation of power components having common active regions therein.

BACKGROUND OF THE INVENTION

An integrated circuit (IC) is a combination of interconnected circuit elements inseparably associated on or within a continuous substrate, the substrate being the supporting material upon which and/or within which an integrated circuit is fabricated. Generally an integrated circuit is fabricated within and/or on a chip of semiconductor material, usually silicon, with the resistors, capacitors, diodes, transistors, etc. (as required) built into and/or on the chip. The semiconductor body is either a single crystal material or single crystal islands in a polycrystalline material, depending on the method for electrical isolation of the circuit components.

A thyristor is a non-linear, solid state device that is bistable; that is, it has both a high and a low impedance state. Typically a thyristor has a four layer PNPN structure. It is usually switched from one impedance state to the other by means of a control of gating signal applied to one of the base regions. A reverse switching rectifier is a two-terminal thyristor having a rectifier with active regions in common with the base regions and circuited in reverse parallel in the same semiconductor body, see U.S. Pat. No. 3,584,270 and Ankrum, *Semiconductor Electronics*, p. 535 (1971). A reverse conducting thyristor is a three-terminal thyristor having a rectifier with active regions in common with the base regions and circuited in reverse parallel in the same semiconductor body, see Kokosa, *IEEE Trans Electron Devices*, ED-17, 669 (1970). These devices have been limited in their turn-off capability, particularly in high conduction states, by reason of their common active regions. That is, when either the equivalent thyristor or rectifier was in the conducting state, the other device could not assume a blocking state before the excess electron-hole carriers were removed from the common base regions. Thus, the device was limited in its applications to slow turn-off applications.

A solid-state ac switch is a bidirectional thyristor. The most common of these thyristors are the "diac" which is a two-terminal switch, and the "triac" which is a three-terminal switch wherein one of the terminals is a gate electrode. Such bidirectional thyristors are mutilayer structures which have the equivalence of two thyristors in a single body, circuited in reverse parallel, see Ankrum, *Semiconductor Electronics*, pp. 531–32 (1971). These devices are limited in their turn-off capability by reason of the common active regions of the equivalent thyristors. During turn-off, these regions must be in a conduction state on one half of the ac cycle and in a blocking state on the other half of the cycle; and the blocking state cannot be normally established in one of the thyristors until the excess electron-hole carriers are removed from the common regions of the device.

To illustrate, most uses of triacs are in resistive-inductive (R-L) circuits where current and voltage are not zero simultaneously. Rather, the initially conducting portion of the triac will conduct into the period of time when the load voltage across the triac has reversed polarity. When formation of a blocking mode is attempted, the load voltage is rising across the device in the direction opposite to the voltage that caused the previous conducting mode. To avoid triggering an immediate conducting mode in the forward biased non-conducting portion of the triac, the triac must have a certain tolerance to this rate of rise of load voltage (dV/dt). This tolerance to rate of rise of load voltage is termed "non-commutating dV/dt" or simply "dV/$dt_c$". This parameter is smaller than the dV/dt of a thyristor on forward biasing because of the common active regions of the two thyristor equivalents of the triac.

It has been proposed to restrict the commutating conductance between the adjacent devices through the common active regions by selective diffusion of gold into the common regions between the devices. See, e.g., U.S. Pat. No. 3,727,116. But this proposal has not provided a satisfactory solution. The gold diffusion increases the recombination centers to provide dynamic isolation between the devices; however, the gold diffusion substantially increases the carrier regeneration rate and correspondingly causes high leakage current that can kill the voltage rating of the device. Further, the gold easily diffuses laterally into the active regions of the devices resulting in limited high current and high frequency operation.

Because of such turn-off limitations, bilateral thyristors, reverse switching rectifiers and reverse conducting thyristors have been limited in their use. Rather, separated discrete thyristors and diodes are wired in reverse parallel to provide fast turn-off in fast switching and high frequency applications. These discrete component circuits do not suffer from the disadvantages characteristic of the integrated circuit devices, but the cost and space savings and reliability attributed to integrated circuits is lost.

SUMMARY OF THE INVENTION

The present invention is provided in an integrated circuit having at least one first component capable of operating in a conductivity modulation state, and having at least one second component having active regions in common with a first component(s). Portions of the common active regions between the first and second components are irradiated to increase the injected carrier recombination rate in said portions without correspondingly increasing the carrier generation rate. Conductivity modulation present in a first component cannot therefore commutate into the second component through the common active regions, but rather is recombined in the irradiated portions and dynamically isolated from the second component.

New power integrated circuits can therefore be provided having fast turn-off capabilities. For example, reverse switching rectifiers, reverse conducting thyristors, and bilateral thyristors can be provided with faster switching and higher frequency capabilities than previously attainable in such devices. The common active regions of one first component in the conducting state need not be free of excess carrier to establish a blocking state in the second component.

Dynamic isolation is preferably preformed by first masking component portions of the integrated circuit against a suitable radiation source while leaving substantially exposed portions of the integrated circuit between the component portions. Thereafter the substantially exposed or unmasked portions of the integrated circuit are selectively irradiated with the radiation source through the mask to increase the injected carrier recombination rate in the portions of the common active regions between components without correspondingly increasing the carrier generation rate thereof.

It is preferred in this connection that the entire thickness of the common active regions between components be irradiated; however, this is not essential to the operation of the invention. The amount of irradiation can be balanced against the conductivity density modulation to be isolated and the tolerance of second component to commutation failure. The irradiation must be sufficient to cause recombination of sufficient carriers without corresponding regeneration of carriers to reduce the conductivity density reaching the second component below the triggering level of the second component to the conducting state. Therefore, it may be appropriate in some applications to irradiate the portions between components through both opposed major surfaces of the semiconductor body either sequentially or simultaneously.

Although any suitable radiation source may be used, electron radiation is preferably used as the radiation source because of availability and inexpensiveness. Moreover, electron radiation (or gamma radiation) may be preferred in some applications where the damage desired in the semiconductor lattice is to single atoms and small groups of atoms. Other nuclear radiation may be preferred depending upon the desired lattice damage and the geometry. For example, neutron, proton and alpha radiation cause very localized surface regions of large disorder. The latter type radiation source may, however, be preferred in certain applications because of its better defined range and better controlled depth of lattice damage, e.g. in silicon-on-sapphire devices. It is anticipated that any kind of radiation may be appropriate provided it is capable of bombarding and disrupting the atomic lattice to create energy levels substantially decreasing injected carrier lifetimes within the common active regions without increasing the carrier generation rates therein by the same amount.

Further, it is preferred that the energy level of electron radiation be between about 1 and 3 Mev. Lower energy level radiation is generally believed to result in substantial elastic collisions with the atomic lattice and, therefore, does not provide enough damage to the lattice in commercially feasible times. Higher energy level radiation is believed to cause too severe of damage to the atomic lattice to maintain certain other electrical characteristics of the device.

It has been found that radiation dosages above about $1 \times 10^{13}$ electrons/cm$^2$ and more desirably above about $4 \times 10^{13}$ electrons/cm$^2$ provide suitable radiation dosages. Lower dosage levels have not been found to affect significant increases in injection recombination rate to provide sufficient dynamic isolation for most integrated curcuits. Conversely, it is preferred that the radiation dosage not exceed about $1 \times 10^{15}$ electrons per cm$^2$, and preferably remain below about $2 \times 10^{14}$ electrons per cm$^2$, with the precise dosage balanced with the degree of isolation desired for the second component.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the preferred embodiments of the invention and present preferred methods of practicing the invention are illustrated in which.

DESCRIPTION OF THE PREFERRED EMBODIMENTS

Figure 1:
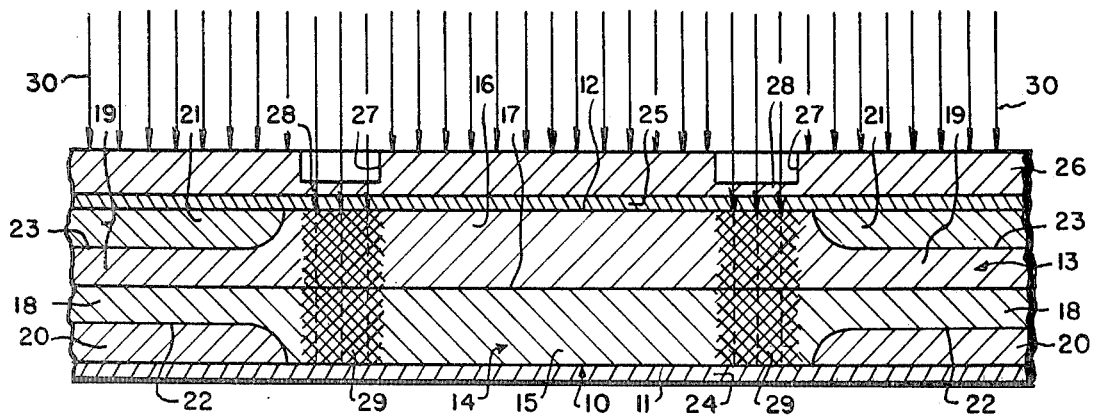
FIG. 1 is a partial elevational view in cross-section of reverse switching rectifier being irradiated in accordance with the present invention.

Referring to FIG. 1, a reverse switching rectifier is provided in an integrated circuit in accordance with the present invention. The circuit is provided in single-crystal semiconductor body 10 having opposed major surfaces 11 and 12. The device has as first component a thyristor 13 peripherally positioned about a centrally located second diode component 14, which is circuited in reverse parallel configuration with thyristor 13.

Diode 14 has cathode region 15 of N-type impurity and anode region 16 of P-type impurity adjoining major surfaces 11 and 12, respectively, and forming in the interior of body 10 therebetween PN junction 17.

Cathode region 15 and anode region 16 are common active regions with anode-base region 18 and cathode-base region 19, respectively, of thyristor 13. Thyristor 13 also has annularly shaped anode-emitter region 20 of P-type impurity and annularly shaped cathode-emitter region 21 of N-type impurity adjoining major surfaces 11 and 12, respectively, and forming PN junctions 22 and 23 in the interior of body 10 with regions 18 and 19, respectively.

The thyristor 13 and diode 14 are circuited in reverse parallel configuration, i.e., antiparallel, by common ohmic metal contacts 24 and 25. Contacts 24 and 25 may be formed by standard sputtering or vapor deposition, or alloying of a suitable metal such as aluminum over surfaces 11 and 12, respectively. Thus, metal contact 24 makes ohmic contact with cathode region 15 and anode-emitter region 20, and metal contact 25 makes ohmic contact with anode region 16 and cathode-emitter region 21.

Selective irradiation is performed on the reverse switching rectifier in accordance with the present invention by masking thyristor 13 and diode 14 with shield plate 26 while leaving exposed an annular portion therebetween. Shield plate 26 has an annular groove 27 with thin portions 28 to maintain its physical integrity while remaining at thin portions 28, typically of 5 to 10 mils in thickness, essentially transparent and non-scattering to a suitable radiation source. The portions of surface 12 adjoining thin portions 28 are thus considered unmasked while the remaining portions of major surface 12 are considered masked by plate 26. Shield plate 26 is of any material of sufficient density and thickness to be opaque to the particular radiation source used. For electron radiation, shield plate 26 may be standard, low carbon steel of about ¼ inch in thickness, or tungsten or lead of about 5/32 inch in thickness. Shield plate 26 is mechanically positioned in contact with metal contact 25 so that after irradiation it may be simply removed for reuse in subsequent irradiations.

After masking, annular portions 29 of common active regions 15-18 and 16-19 between the thyristor 13 and the diode 14 are irradiated by radiation 30 to increase the injected carrier recombination rate without correspondingly increasing the carrier generation use. Care should be taken during irradiation not to irradiate portions of the emitter regions 20 and 21 of thyristor 13 and kill the injection efficiency of thyristor 13. The irradiation may be performed with any suitable radiation, dependent upon the composition of semiconductor body 10 and the desired depth of penetration of the irradiation into semiconductor body 10. Typically, the radiation source can be an electron beam having an energy level between about 1 and 3 Mev produced by a Van de Graaf Accelerator, preferably where the irradiation is carried to a dosage level between about $1 \times 10^{13}$ and $1 \times 10^{15}$ electrons per cm$^2$ and most desirably between $4 \times 10^{13}$ and $2 \times 10^{14}$ electrons per cm$^2$.

As stated before, electron radiation is preferred for use as the radiation source because of availability and inexpensiveness. Moreover, electron radiation (and gamma radiation) may be preferred in some applications where the dimensions of the irradiated portion are to be defined with high resolution, e.g., less than 5 microns, and/or where the damage desired in the semiconductor lattice is to single atoms and small groups of atoms. This is in contrast to neutron, proton and alpha radiation which produce intense localized disordered regions of as many as a few hundred atoms in the semiconductor crystal and which cause considerable scattering at the boundary of the unmasked portion. The latter type of radiation may, however, be preferred for the radiation source in certain applications because of its better defined range and better controlled depth of lattice damage.

Electron radiation is also preferred over gamma radiation because of its availability to provide adequate dosages in short periods of time practical for device manufacture. Adequate dosages of gamma radiation may require several weeks to be applied, while such dosages of electron radiation could be applied in minutes.

Further as previously stated the irradiation dosage is balanced against the conductivity modulation encountered in the first component and the conductivity modulation tolerable in the second component. Preferably, the irradiated portion extends through the entire thickness of the common active regions. Therefore, where, as here, the common active regions of the diode extend through the entire thickness of the semiconductor body 10, it is appropriate to irradiate selected portions of major surface 11 as well as major surface 12 as above described. This, however, may cause difficulties in alignment if it is done sequentially. Thus, it is preferred in such instances to selectively irradiate portions 29 through unmasked portions of surfaces 11 and 12 simultaneously.

In operation, the reverse switching rectifier is useful in pulse work because of its high dV/dt and fast switching capabilities. The device, which is itself an integrated circuit, conducts in the forward direction as a normal junction rectifier through diode 14. While in the reverse direction, the device blocks voltages up to the value at which thyristor 13 switches to the low-impedance state, where the thyristor conducts until the current is reduced to below the holding value. The device is thus applicable where the diode must withstand high transcient reverse voltage higher than the reverse blocking rating and a transcient reverse current can be tolerated in the circuit, see U.S. Pat. No. 3,584,270 for further operation details of the reverse switching rectifier.

The selectively irradiated reverse switching rectifier of the present invention is able to perform in high modulation, i.e. high frequency and fast switching, power applications, where similar devices could not heretofore be used. The difficulty with previous devices is that in power applications a conductivity modulation is encountered in the diode portion in the forward direction which, on switching, prematurely triggers the thyristor through the common active regions into the conducting state. However, with the presence of irradiated annular portion 29 of the common active regions about the diode 14, the excess carriers of the conductive mode is not able to laterally commutate into the thyristor 13 through the common active regions. Rather, the irradiated portion 29 dynamically isolates the conductivity modulation by providing a region in which high injected carrier recombination rates occur without corresponding carrier generation rates. The carriers are thus recombined in portion 29 and do not reach the common base regions of thyristor where the carriers could prematurely trigger the thyristor to the conduction state.

Figure 2:
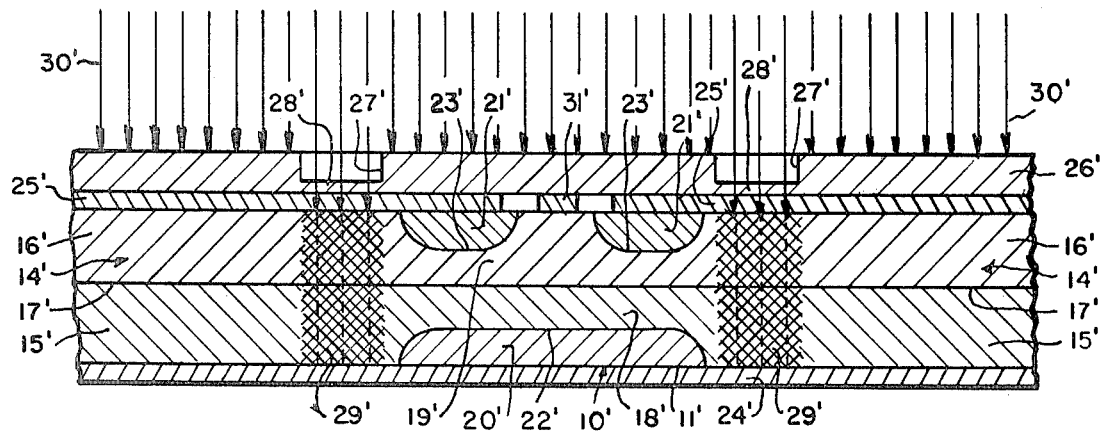
FIG. 2 is a partial elevational view in cross-section of a reverse conducting thyristor being irradiated in accordance with the present invention.

Referring to FIG. 2, the present invention can be utilized in making a reverse conducting thyristor with fast turn-off (i.e. fast switching and high frequency) capabilities simply by varyng the contacts and changing the geometry and location of cathode- and anode-emitter regions 21' and 20', preferably to position the thyristor centrally of the diode and to provide for a center gate electrode. Specifically contact 25' is annular so that a separate ohmic contact can be made to cathode-base region 19' at the center of the body. Cathode-emitter region 21' is spaced centrally from irradiated portion 29' and gate contact 31' is spaced centrally from cathode-emitter region 21' to make ohmic contact at surface 12' to cathode-base region 12'. It should also be noted in this connection that the thyristor may alternatively be placed annularly about the diode instead of as shown to form an alternative reverse conducting thyristor embodying the present invention. Further, shunts (not shown) are preferably provided through cathode-emitter regions 21', and high doping concentrations may be provided in cathode region 15' and/or anode-emitter region 20' to optimize and tailor the electrical characteristics of the components as desired.

Figure 3:
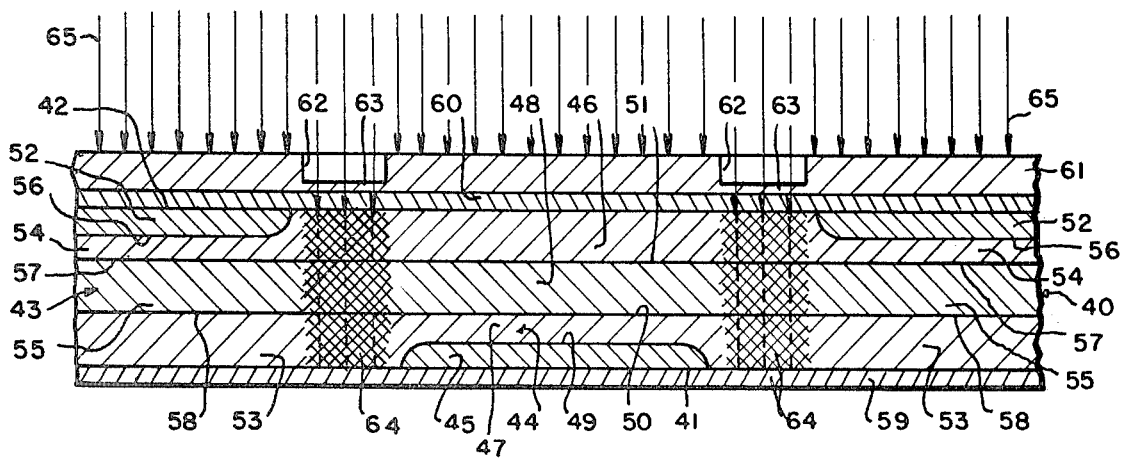
FIG. 3 is a partial elevational view in cross-section of a diac being irradiated in accordance with the present invention.

Referring to FIG. 3, a two-terminal bidirectional thyristor (sometimes called a "diac") is provided in an integrated circuit in accordance with the present invention. The circuit is provided in single crystal semiconductor body 40 having opposed major surfaces 41 and 42. The device has as first component a thyristor 43 peripherally positioned about a centrally located second component, thyristor 44, circuited in reverse parallel with thyristor 43.

Thyristor 44 has cathode-emitter region 45 of N-type impurity and anode-emitter 46 of P-type impurity adjoining surfaces 41 and 42, respectively. Positioned between the emitter regions 45 and 46 in the interior of body 40 are cathode-base region 47 of P-type impurity and anode-base region 48 of N-type impurity. A four layer PNPN configuration of circular shape is thus provided in body 40 with PN junction 49 between cathode-emitter and cathode-base regions 45 and 47, PN junction 50 between cathode-base and anode-base regions 47 and 48, and PN junction 51 between anode-emitter region and anode-base regions 46 and 48.

Thyristor 43 has cathode-emitter region 52 of N-type impurity and anode-emitter region 53 of P-type impurity adjoining major surfaces 42 and 41, respectively. Positioned between emitter regions 42 and 43 in the interior of body 40 are cathode-base region 54 of P-type impurity and anode-base region 55 of N-type impurity. A four layer PNPN structure of annular shape is thus provided in semiconductor body 40 with PN junction 56 between anode-emitter and anode-base regions 52 and 54, PN junction 57 between cathode-base and anode-base regions 54 and 55, and PN junction 58 between anode-emitter and anode-base regions 53 and 55.

Thyristors 43 and 44 are thus formed in reverse configuration within semiconductor body 40. The thyristors have common active regions with regions 47 and 53, with regions 48 and 55, and with regions 46 and 54, respectively. Also, PN junctions 50 and 58 are common; and PN junctions 51 and 57 are common.

Thyristors 43 and 44 are circulated in reverse parallel configuration by common ohmic metal contacts 59 and 60. Contacts 59 and 60 may be formed by sputtering or vapor depositing, or alloying suitable metal by standard techniques over surfaces 41 and 42, respectively. Thus, metal contact 57 makes ohmic contact with cathode-emitter region 45 and anode-emitter region 53, and metal contact 60 makes ohmic contact with anode-emitter region 46 and cathode-emitter region 52.

Selective irradiation is performed on the diac in accordance with the present invention by masking thyristors 43 and 44 with shield plate 61 while leaving a portion substantially exposed therebetween. Shield plate 61 has an annular groove 62 with thin portions 63 to maintain its physical integrity while remaining at thin portions 63 essentially transparent and non-scattering to a suitable radiation source. The portions of surface 42 adjoining thin portions 63 are thus considered substantially exposed and unmasked while the remaining portions of surface 42 are considered masked by shield plate 61. Shield plate 61 is of any suitable material of sufficient density and thickness to be opaque to the radiation source used. For electron radiation, shield plate 61 may be standard low carbon steel of about ¼ inch in thickness, or tungsten or lead of about 5/32 inch in thickness. Shield plate 61 is mechanically positioned in contact with metal contact 60 so that after irradiation it may be simply removed for reuse in subsequent irradiations.

After masking annular portion 64 of common active regions 47–53, 48–55 and 46–54 are irradiated with suitable irradiation 65 to increase the injected (i.e. excess above equilibrium concentration) carrier recombination rate in portion 64 without correspondingly increasing the carrier generation rate. Again care is taken not to irradiate the emitter regions of the devices and substantially lower the injection efficiencies of the thyristors. As previously explained in connection with FIG. 1, the radiation source is preferably an electron beam having an energy level between 1 and 3 Mev, wherein the irradiation dosage level is preferably between about $1 \times 10^{13}$ and $1 \times 10^{15}$ electrons per $cm^2$ and most desirably between about $4 \times 10^{13}$ and $2 \times 10^{14}$ electrons per $cm^2$. As previously noted, however, the radiation source 65 may be any suitable irradiation as may be appropriate for the particular composition of the semiconductor body and the particular depth of penetration desired for the irradiation. Further, as previously noted, the irradiation may, if desired, be performed selectively as above described through both major surfaces 41 and 42 either sequentially or simultaneously.

In operation the diac is useful particularly as a bilateral switch. The device blocks in the forward action until the applied voltage is above the breakover voltage of the blocking junctions of the thyristor 44 at which value thyristor 44 switches to the low impedance state where it conducts until the current is reduced to below the holding value. In the reverse direction, the device blocks voltages until the value of the applied voltage is above the breakover voltage of the reverse bias junctions of thyristor 44 at which value thyristor 44 switches to the low impedance state where it conducts until the current is reduced to below the holding value.

Such bilateral switches are particularly useful in the control of a high power ac current supply. The difficulty with previous devices is that in such power applications the conductivity modulation encountered in the conducting state would, on switching, prematurely trigger the other thyristor by commutation of excess carriers through the common active regions. With the presence of irradiated annular portions 64 of the common impurity regions, the conductivity modulation is however not able to laterally commutate into the other thyristor. Rather, the irradiated portions 64 dynamically isolates the conductivity conduction by providing a region in which the injected electron-hole carriers rapidly recombined so that they may not reach the common base regions of the other thyristor and prematurely trigger that thyristor to the conduction state.

Figure 4:
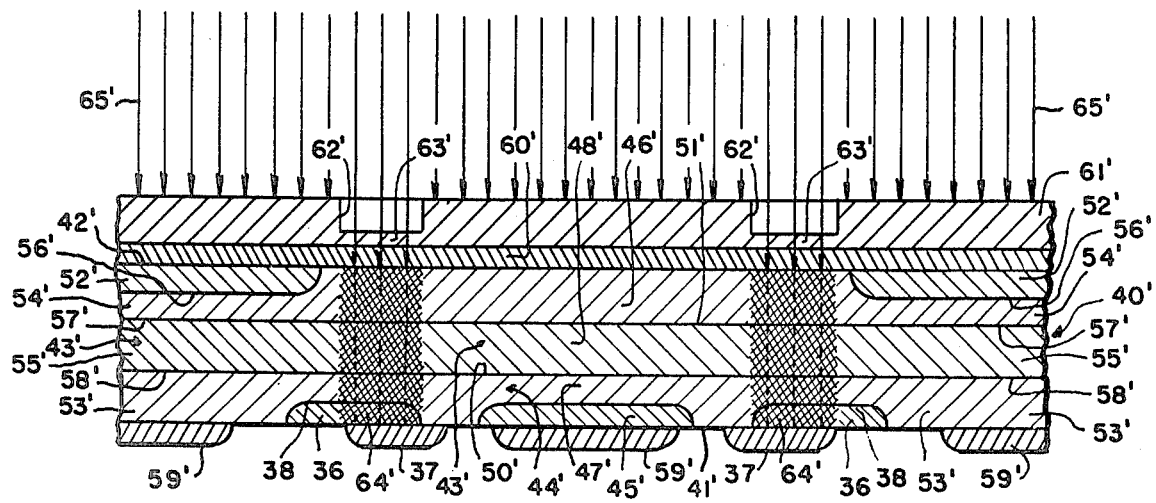
FIG. 4 is a partial elevational view in cross-section of a triac being irradiated in accordance with the present invention.

Referring to FIG. 4, an alternative, three-terminal ac switch and bidirectional thyristor (sometimes called a "triac") is provided in an integrated circuit in accordance with the present invention. The triac has substantially all of the same components as the diac described in FIG. 3 with few variations, and the description in FIG. 4 is therefore by prime numbers to connote similar elements and components. The variations are that metal contact 59' comprises two parts: a central circular portion ohmically connected to cathode-emitter region 45' and an outer annular portion ohmically connected to anode-emitter 53' peripheral of annular irradiated portion 64'. Further, annular gating region 36 is provided adjoining major surface 41' at least partially about irradiated portion 64' forming PN junction 38 with anode emitter region 53' to provide for remote gate switching of thyristor 43'. And finally, gate electrode 37 is annularly positioned at least partially within irradiated portions 64' to make ohmic contact with remote gating region 36 and cathode-base region 47' of thyristor 44'. Again care is taken not to irradiate the emitter regions, as well as the portion of gating region 36 toward thyristor 40, so that the injection efficiencies of those regions are not substantially reduced. It should be observed that the selective irradiation could also be performed with shield plate 61' contacting electrodes 59' and 37 where it is desired to alloy a support substrate electrode to the semiconductor body before irradiation.

In operation the triac operates in the forward direction as a normal forward biased thyristor gated with a signal applied to electrode 37 to the cathode base region 47'. While in the reverse direction, the triac is switched by remote gating. That is, if gate electrode 37 is, for example, made negative with respect to contact 59', electrons are injected from gating region 36 in P-region 53' and diffused toward PN junction 58', where they are collected. These collected electrons lower the potential of region 55' with respect to region 53' (i.e. the forward bias of PN junction 58' is increased) so that holes are injected from region 53' into region 55'. These holes diffuse across region 55', are collected by PN junction 57', raise the potential of region 54' with respect to region 52' and increase the forward bias of the PN junction 56''. This causes electrons to be injected from region 52' into region 54'. These electrons diffuse to PN junction 57', where they are collected and lower the potential of region 55' so that more holes are injected from region 53' into region 55'. This process continues until the thyristor 53' switches to the conduction state. Thus the triac can be gated to the conduction state in either direction by negative gate current for negative potential from contact 59' to contact 60' or by positive gate current for positive potential from contact 59' to contact 60'. These are, of course, only preferred gate current polarities. Either polarity can switch the triac into the conduction state for each polarity of applied voltage, with the preferred polarities requiring smaller gate currents.

As with the diac, it can be seen that the irradiated portion 64' prevents undesirable commutation and triggering of one thyristor into the conduction state on switching where the other thyristor is in the conduction state. Again dynamic isolation of the current modulation is accomplished by recombination in the irradiated portion.

Figure 5:
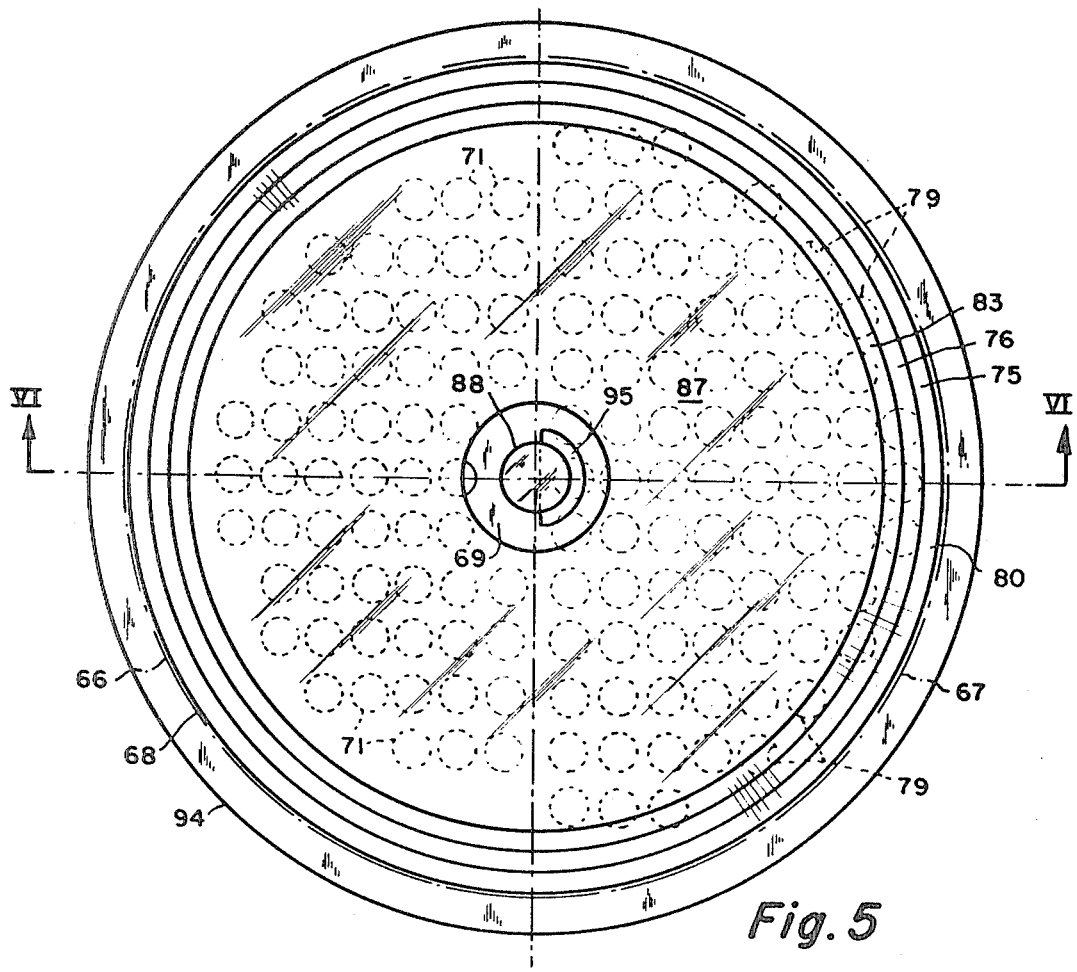
FIG. 5 is a top view of a triac in accordance with the present invention.
Figure 6:
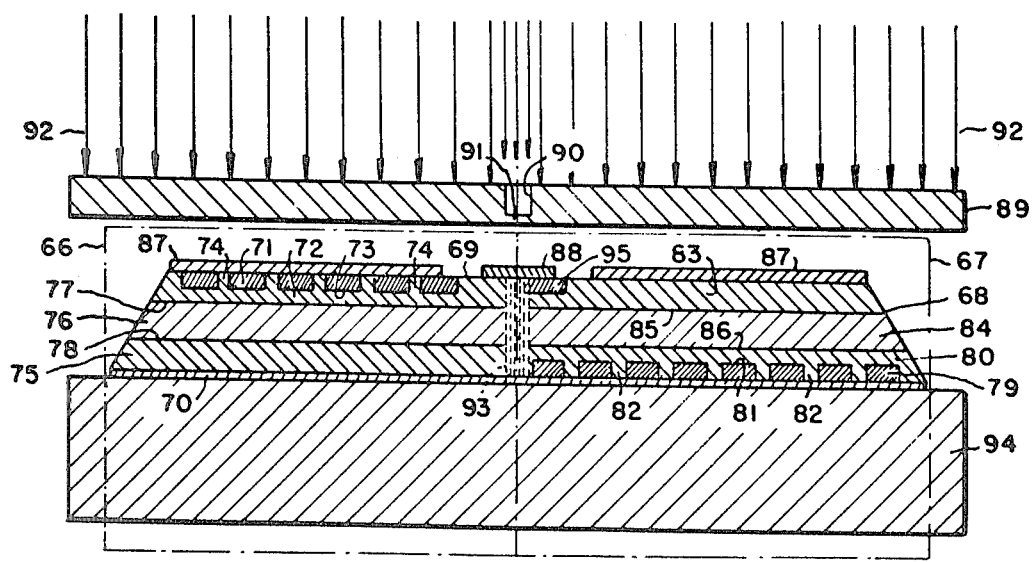
FIG. 6 is a cross-sectional view taken along line VI—VI of FIG. 5, with a radiation mask and radiation beam shown.

Regerring to FIGS. 5 and 6, an alternative triac of the present invention is shown that was tested as hereinafter described. The triac comprises first and second thyristor components 66 and 67 shown in chainline positioned adjacent each other in single-crystal silicon semiconductor body having opposed major surfaces 69 and 70. Thyristor components 66 and 67 are positioned electrically in reverse parallel with common base regions and a common gate electrode.

Thyristor component 66 has cathode-emitter region 71 of N-type impurity adjoining major surface 69. Cathode-emitter region 71 is typically doped with phosphorus to a surface impurity concentration of about $1-1.5 \times 10^{20}$ impurities per cubic centimeter. Adjoining cathode-emitter region 71 is cathode-base region 72 of P-type impurity of a concentration typically between about $1 \times 10^{16}$ and $1 \times 10^{18}$ impurities per cubic centimeter formed by diffusion typically of aluminum or gallium. Cathode-base region 72 forms PN junction 73 with cathode-emitter region 71 and extends intermittently through cathode-emitter region 71 to adjoin major surface 69 and form shunts 74 through cathode-emitter region 71.

Thyristor component 66 also has anode-emitter region 75 of P-type impurity adjoining major surface 70. Anode-emitter region 75 typically has a surface impurity concentration of about $1 \times 10^{18}$ impurities per cubic centimeter and is formed typically by diffusion of aluminum or gallium simultaneously with the diffusion of cathode-base region 72. Anode-base region 76 of N-type impurity adjoins cathode-base region 72 and anode-emitter region 75 interior of semiconductor body 68 and forms PN junctions 77 and 78, respectively, with cathode-base region 72 and anode-emitter region 75.

Thyristor component 67 is formed simultaneously with thyristor component 66. Thyristor component 67 comprises cathode-emitter region 79 adjoining major surface 70 with a surface impurity concentration of about $1-1.5 \times 10^{20}$ impurities per cubic centimeter. Preferably, cathode-emitter region 79 is formed simultaneously by selective diffusion along with cathode-emitter region 71. Cathode-base region 80 of P-type impurity adjoins cathode-emitter region 79 forming PN junction 81 with cathode-emitter region 79 and extending intermittently through to adjoin major surface 70 and form shunts 82 through cathode-emitter region 79. Cathode-base region 80 is a common active region with anode-emitter region 75 and is typically simultaneously formed by diffusion along with cathode-base region 72 and anode-emitter region 75.

Thyristor component 67 also has anode-emitter region 83 of P-type impurity adjoining major surface 69. Anode-emitter region 83 is common with cathode-base region 72 and is typically simultaneously formed by diffusion along with cathode-base region 72, anode-emitter region 75 and cathode-base region 80. Anode-base region 84 of N-type impurity adjoins cathode-base region 80 and anode-emitter region 83 internal of semiconductor body 68 and forms PN junctions 85 and 86, respectively, with cathode-base and anode-emitter regions 80 and 83. Anode-base region 84 is common with anode-base region 76, which are formed by the original doping of semiconductor body 68 during its making.

Remote gating region 95 is also formed in thyristor component 67 adjoining major surface 69 centrally of semiconductor body 68. Gating region 95 is preferably formed by diffusion along with cathode-emitter regions 71 and 79.

Thyristor components 66 and 67 are circuited in reverse parellel configuration by first mounting, typically by alloying, semiconductor body 68 to electrode 94. Electrode 94, which is typically molybdenum, makes ohmic contact with semiconductor body 68 along the entire major surface 70 to form the anode electrode of thyristor component 66 and the cathode electrode of thyristor component 76. Electrodes 87 and 88 are then formed on major surface 69 preferably by sputtering or vapor deposition of a metal such as aluminum over the entire surface followed by selective removal of the deposited metal by standard photolithographic and etch techniques. The electrodes 87 and 88 are thus formed with electrode 87 in an annulus, with electrode 88 positioned centrally thereof at the center of semiconductor body 68. Electrode 87 thus makes ohmic contact with the semiconductor body 68 at major surface 69 and forms the cathode electrode of thyristor component 66 and the anode electrode of thyristor component 67. Electrode 88, together with gating region 95, forms the common gate electrode of thyristor components 66 and 67.

The triac is then selectively irradiated at the common active regions 72-83, 75-80 and 76-84 between the thyristor components 66 and 67. The selective radiation is accomplished by positioning mask or shield plate 89 adjacent electrodes 87 and 88. Shield plate 89 has groove 90 extending through the center thereof, to maintain the physical integrity of shield plate 89 while providing thin portions 91 (typically of five to ten mils in thickness) essentially transparent and non-scattering to a suitable radiation source. The portions of semiconductor body 68 are adjoining thin portion 91 of shield plate 89 are thus considered unmasked while the remaining portions of the semiconductor body 68 are considered masked by plate 89 against radiation. Shield plate 89 is of any material of sufficient density and thickness to be opaque to the particular radiation source used. For electron irradiation, shield plate 89 may be standard, low-carbon steel of about ¼ inch in thickness or tungsten or lead of 5/32 inch in thickness.

On positioning of shield plate 89, the triac is selectively exposed to radiation 92, which is typically electron irradiation having an energy level of between about 1 and 3 Mev. Selective irradiation produces irradiated portions 93 extending through semiconductory body 69 and common active regions 72-83, 75-80 and 76-84 between thyristor components 66 and 67. Again care is taken not to irradiate the emitter regions and the portion of the gating region toward thyristor 67 so that the injection efficiencies of these regions and portions of regions are not substantially reduced. The irradiation is preferably continued until the radiation dosage is between about $1 \times 10^{13}$ and $1 \times 10^{15}$ electrons per cm$^2$ and most desirably between $4 \times 10^{13}$ and $2 \times 10^{14}$ electrons per cm$^2$.

Figure 7:
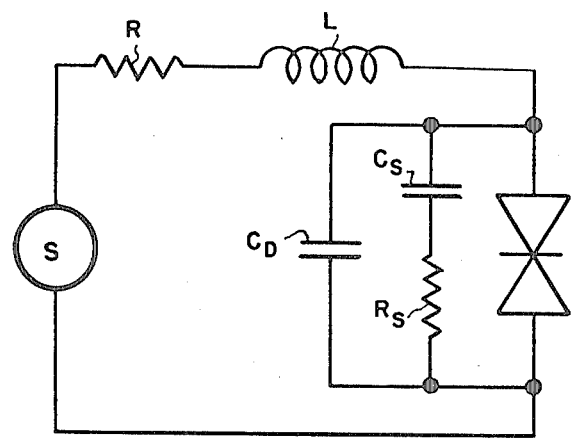
FIG. 7 is a schematic of a test circuit in which the triac shown in FIGS. 5 and 6 was tested.

To illustrate the operation of the invention, a triac as described in connection with FIGS. 5 and 6 was tested before and after selective irradiation. The triacs were tested in a R-L circuit as shown in FIG. 7. To protect against application of excessive dV/dt to the triac by energy trapped in the inductor (L), capacitor ($C_D$) and capacitor ($C_S$) and resistor ($R_S$) are circuited in parallel across the triac. For proper testing, capacitor ($C_S$) is selected with a value so that commutating failure can occur. That is, the dV/dt applied to the triac can exceed dV/dt$_c$. However, the parameters are selected and controlled by source (S), a function generator, so that, when commutation failure occurs and the triac is 100% conducting, fusion and failure does not occur.

Figure 8:
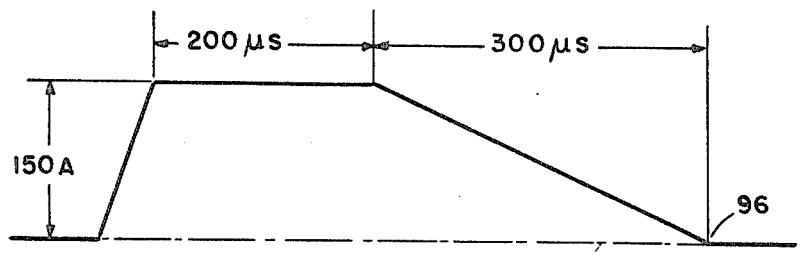
FIG. 8 is a schematic of a current waveform applied to the triac shown in FIGS. 5 and 6 and in the circuit shown in FIG. 7.

The triacs tested were subjected to the current waveform shown in FIG. 8. The time durations and current rate of decay are believed representative of those normally found in triac circuits (i.e. 50-60 H$_z$). At the end of the conduction mode for the conducting half of the triac, the triac experiences a normal reverse recovery as shown at 96 in FIG. 8. After reverse recovery, one-half of the triac is ready to support reverse voltage, and if the rate of rise of dV/dt is not greater than dV/dt$_c$, the other half of the triac will support and enter a forward blocking state where the reverse voltage is supported. The dV/dt can be controlled with the source(s) function generator so that the test conditions can be optimized.

The non-commutating dV/dt test results for non-irradiated triacs is shown in Table I below, and the non-commutating dV/dt for selectively irradiated triacs is shown in Table II below. The irradiation dosage and test conditions are also given as part of the tables. Additional data on the triacs irradiated is given in Table III below.

TABLE I

| Conditions: | | |
|---|---|---|
| | Anode Voltage | T$_2$(+) |
| | Anode Current | 150A |
| | Case Temperature | 125° C. |
| | Reapplied Voltage | 400 Volts, variable dV/dt, applied at reverse recovery current peak |
| | Current Decay Rate | + .5A/ μsec |
| | Radiation Dosage | None |
| Device | dV/dt$_c$ (volts/ μsec) | |
| Type I Triac 70A | | |
| 1 | 200 | |
| Type II Triac 150A | | |
| 1 | 34 | |
| 2 | 30 | |
| 3 | 150 | |
| 4 | 20 | |
| 5 | 16 | |
| 6 | 12 | |
| Type III Triac 300A | | |
| 1 | >200 | |
| 2 | Won't support dV/dt | |
| 3 | >200 | |
| 4 | 30 | |
| 5 | >200 | |

TABLE II

| Conditions: | | |
|---|---|---|
| | Anode Voltage | T$_2$(+) |
| | Anode Current | 150A |
| | Case Temperature | 125° C. |
| | Reapplied Voltage | 400 volts, variable dV/dt, applied at reverse recovery current peak. |
| | Current Decay Rate | + .5A/ μsec |
| | Radiation Dosage | $5 \times 10^{13}$ /cm$^2$ |
| Device | dV/dt$_c$ (volts/ μsec) | |
| Type I Triac 70A | >200 | |
| Type II Triac 150A | | |
| 1 | 200 | |
| 2 | 200 | |
| 3 | >150 | |
| 4 | >200 | |
| 5 | 60 | |
| 6 | 50 | |
| Type III Triac 300A | | |
| 1 | >200 | |
| 2 | — | |
| 3 | >200 | |
| 4 | >200 | |
| 5 | >200 | |

TABLE III

| | Vs = 50 volts | Tc = 25° C. | | |
|---|---|---|---|---|
| Device | V$_{gt}$ (volts) | I$_{gt}$ (milliamps) | I$_{cx}$ (milliamps) | I$_{ho}$ (milliamps) |
| Type I triac- 70 A | | | | |
| 1 | 1.25 | 65 | 112 | 64 |
| Type II triac- 150A | | | | |
| 1 | .90 | 40 | 60 | 39 |
| 2 | .93 | 42 | 62 | 32 |
| 3 | .85 | 46 | 64 | 39 |
| 4 | .75 | 40 | 58 | 36 |
| 5 | .85 | 90 | 60 | 36 |
| 6 | .90 | 36 | 44 | 33 |

TABLE III-continued

| Vs = 50 volts | | Tc = 25° C. | |
|---|---|---|---|
| Type III triac- 300 A | | | |
| 1 | .80 | 32 | 48 | |
| 2 | | | | |
| 3 | .85 | 32 | 48 | 36 |
| 4 | .70 | 35 | 48 | 32 |
| 5 | 1.30 | 85 | 100 | 62 |

| | $I_{gtmax}$ (milliamps) | $V_{gtmax}$ (volts) | $I_{cx}$ | $I_{ho}$ |
|---|---|---|---|---|
| Spec Value | | | | |
| Type I triac | 150 | 3.0 | none | none |
| Type II triac | 150 | 3.0 | none | none |
| Type III triac | 350 | 3.0 | none | none |

As can readily seem by comparing Tables I and II, the non-commutating dV/dt is distinctly improved by selective irradiation. Yet, the gate trigger and other electrical characteristics remain within original specifications on radiation of the triacs.

While presently preferred embodiments have been shown and described with particularity, it is distinctly understood that the invention may be otherwise variously embodied and used within the scope of the following claims.

What is claimed is:

1. A method of dynamically isolating conductivity modulation state in a component of an integrated circuit comprising the steps of:
   A. forming an integrated circuit including at least first and second components having at least one common active region in a semiconductor body having at least one major surface, said first component being capable of operating in a conductivity modulation state;
   B. selectively masking portions of the major surface at the first and second components of the integrated circuit against a radiation source; and
   C. selectively irradiating portions of the active common region between the first and second components through substantially unmasked portions of said major surface from said radiation source to dynamically isolate conductivity modulation in the first component from the second from commutating into the second component through the common active regions by recombining injected carriers in the irradiated portions and reducing below a tolerable level the conductivity modulation before entering the second component.

2. A method of dynamically isolating conductivity modulation state in integrated circuits as set forth in claim 1 wherein:
   the radiation source is electron radiation having an energy level between about 1 and 3 Mev.

3. A method of dynamically isolating conductivity modulation state in integrated circuits as set forth in claim 2 wherein:
   the radiation dosage of the irradiated portions of the common active region between the first and second components is between about $1 \times 10^{13}$ and $1 \times 10^{15}$ electrons per cm$^2$.

4. A method of dynamically isolating conductivity modulation state in integrated circuits as set forth in claim 2 wherein:
   the radiation dosage of the irradiated portions of the common active region between the first and second components is between about $4 \times 10^{13}$ and $2 \times 10^{14}$ electrons per cm$^2$.

5. A method of increasing the non-commutating dV/dt capability of a bidirectional thyristor comprising the steps of:
   A. forming in a semiconductor body between opposed major surfaces thereof a bidirectional thyristor comprised of two thyristor components positioned adjacent each other in a reverse parallel configuration and having three common active regions corresponding to cathode-base and anode-emitter regions, anode-base and anode-base regions, and anode-emitter and cathode-base regions of the respective thyristor components;
   B. selectively masking portions of a major surface at the thyristor components against a radiation source; and
   C. selectively irradiating portions of the common active regions between the thyristor components through substantially unmasked portions of said major surface from said radiation source to dynamically isolate conductivity modulation in one of the thyristor components from commutating through the common active regions into the other thyristor component by recombining injected carriers in the irradiated portions and reducing below a tolerable level the conductivity modulation before entering the other thyristor components.

6. A method of increasing the non-commutating dV/dt capability of a bidirectional thyristor as set forth in claim 5 wherein:
   the radiation source is electron radiation having an energy level between about 1 and 3 Mev.

7. A method of increasing the non-commutating dV/dt capability of a bidirectional thyristor as set forth in claim 6 wherein:
   the radiation dosage of the irradiated portions of the common active regions between the first and second components is between about $1 \times 10^{13}$ and $1 \times 10^{15}$ electrons per cm$^2$.

8. A method of increasing the non-commutating dV/dt capability of a bidirectional thyristor as set forth in claim 6 wherein:
   the radiation dosage of the irradiated portions of the common active regions between the first and second components is between about $4 \times 10^{13}$ and $2 \times 10^{14}$ electrons per cm$^2$.

9. A method of increasing the non-commutating dV/dt capability of a reverse switching rectifier or a reverse conducting thyristor comprising the steps of:
   A. forming in a semiconductor body between opposed major surfaces thereof a thyristor component having cathode-emitter and anode-emitter regions adjoining said major surfaces, and a diode component adjacent said thyristor component having anode and cathode regions adjoining said major surfaces and being common active regions with the cathode-base and anode-base regions of the thyristor component;
   B. selectively masking portions of a major surface at the thyristor and diode components against a radiation source; and
   C. selectively irradiation portions of the common active regions between the thyristor and diode components through substantially unmasked portions of said major surface from said radiation source to dynamically isolate conductivity modulation in one of the components from commutating through the common active regions into the other component by recombining injected carriers in the irradiated portions and reducing below a tolerable level the conductivity modulation before entering the other component.

10. A method of increasing the non-commutating dV/dt capability of a reverse switching rectifier or a reverse conducting thyristor as set forth in claim 9 wherein:
the radiation source is electron radiation having an energy level between 1 and 3 Mev.

11. A method of increasing the non-commutating dV/dt capability of a reverse switching rectifier or a reverse conducting thyristor as set forth in claim 10 wherein:
the radiation dosage of the irradiated portions of the common active regions between the first and second components is between about $1 \times 10^{13}$ and $1 \times 10^{15}$ electrons per $cm^2$.

12. A method of increasing the non-commutating dV/dt capability of a reverse switching rectifier or a reverse conducting thyristor as set forth in claim 10 wherein:
the radiation dosage of the irradiated portions of the common active regions between the first and second components is between about $4 \times 10^{13}$ and $2 \times 10^{14}$ electrons per $cm^2$.

* * * * *